(12) United States Patent
Ratcha et al.

(10) Patent No.: US 9,911,889 B2
(45) Date of Patent: Mar. 6, 2018

(54) METHOD FOR FABRICATING A HETEROJUNCTION SCHOTTKY GATE BIPOLAR TRANSISTOR

(71) Applicants: QATAR UNIVERSITY, Doha (QA); TEXAS A&M UNIVERSITY SYSTEM, College Station, TX (US)

(72) Inventors: Aditya Chandra Sai Ratcha, Kingsville, TX (US); Amit Verma, Cypress, TX (US); Reza Nekovei, Corpus Christi, TX (US); Mahmoud M. Khader, Doha (QA)

(73) Assignees: QATAR UNIVERSITY, Doha (QA); TEXAS A&M UNIVERSITY SYSTEM, College Station, TX (US)

( * ) Notice: Subject to any disclaimer, the term of this patent is extended or adjusted under 35 U.S.C. 154(b) by 0 days.

(21) Appl. No.: 15/699,436

(22) Filed: Sep. 8, 2017

(65) Prior Publication Data
US 2018/0013032 A1    Jan. 11, 2018

Related U.S. Application Data

(62) Division of application No. 15/149,979, filed on May 9, 2016, now Pat. No. 9,793,430.

(51) Int. Cl.
| | |
|---|---|
| H01L 21/74 | (2006.01) |
| H01L 31/11 | (2006.01) |
| H01L 31/18 | (2006.01) |
| H01L 31/0352 | (2006.01) |
| H01L 31/0304 | (2006.01) |

(52) U.S. Cl.
CPC .... H01L 31/1105 (2013.01); H01L 31/03046 (2013.01); H01L 31/03529 (2013.01); H01L 31/035263 (2013.01); H01L 31/1844 (2013.01)

(58) Field of Classification Search
CPC ................ H01L 21/74; H01L 27/0262; H01L 29/41708; H01L 29/7393
See application file for complete search history.

(56) References Cited

U.S. PATENT DOCUMENTS

2012/0139005 A1*  6/2012  Ikimura ............. H01L 27/0623
                                                      257/139

* cited by examiner

*Primary Examiner* — Hoai V Pham
(74) *Attorney, Agent, or Firm* — Squire Patton Boggs (US) LLP

(57) ABSTRACT

Certain embodiments of the present invention may be directed to a transistor structure. The transistor structure may include a semiconductor substrate. The semiconductor substrate may include a drift region, a collector region, an emitter region, and a lightly-doped/undoped region. The lightly-doped/undoped region may be lightly-doped and/or undoped. The transistor structure may also include a heterostructure. The heterostructure forms a heterojunction with the lightly-doped/undoped region. The transistor structure may also include a collector terminal. The collector terminal is in contact with the collector region. The transistor structure may also include a gate terminal. The gate terminal is in contact with the heterostructure. The transistor structure may also include an emitter terminal. The emitter terminal is in contact with the lightly-doped/undoped region and the emitter region.

9 Claims, 7 Drawing Sheets

METHOD FOR FABRICATING A HETEROJUNCTION SCHOTTKY GATE BIPOLAR TRANSISTOR

CROSS REFERENCE TO RELATED APPLICATION

This application is a divisional application that claims priority to U.S. non-provisional application Ser. No. 15/149,979, filed on May 9, 2016. The entire content of the above-referenced application is hereby incorporated by reference.

BACKGROUND

Field

Certain embodiments of the present invention may relate to a heterojunction schottky gate bipolar transistor.

Description of the Related Art

Certain embodiments of the present invention provide improvements over traditional insulated-gate bipolar transistors. An insulated-gate bipolar transistor is generally understood as a three-terminal power semiconductor device that may operate as an electronic switch. The insulated-gate bipolar transistor can generally provide switching that occurs in a fast manner, with good efficiency. Insulated-gate bipolar transistors have been used in a wide variety of modern appliances.

SUMMARY

According to a first embodiment, a transistor structure may include a semiconductor substrate. The semiconductor substrate may include a drift region, a collector region, an emitter region, and a lightly-doped/undoped region. The lightly-doped/undoped region may be lightly-doped and/or undoped. The transistor structure may also include a heterostructure. The heterostructure may form a heterojunction with the lightly-doped/undoped region. The transistor structure may also include a collector terminal. The collector terminal is in contact with the collector region. The transistor structure may also include a gate terminal. The gate terminal is in contact with the heterostructure. The transistor structure may also include an emitter terminal. The emitter terminal may be in contact with the lightly-doped/undoped region and the emitter region.

In the transistor structure of the first embodiment, the drift region may include an N− doped region.

In the transistor structure of the first embodiment, the collector region may include a P+ doped region.

In the transistor structure of the first embodiment, the emitter region may include an n+ doped region.

In the transistor structure of the first embodiment, the semiconductor substrate may include Gallium arsenide.

In the transistor structure of the first embodiment, the heterostructure may include Aluminum gallium arsenide.

In the transistor structure of the first embodiment, the heterostructure may be n+ doped.

In the transistor structure of the first embodiment, the transistor structure may be configured to be optically-controllable via illumination upon the gate terminal.

In the transistor structure of the first embodiment, a quantum well corresponding to the heterojunction may provide a low resistance channel for a flow of electrons.

According to a second embodiment, a method for fabricating a transistor structure may include performing a photolithography process to transfer a device pattern onto a semiconductor substrate. The semiconductor substrate may include a drift region and a lightly-doped/undoped region, and the lightly-doped/undoped region may be lightly-doped and/or undoped. The method may also include doping a collector region of the substrate. The method may also include doping an emitter region of the substrate. The method may also include forming a heterostructure. The heterostructure may form a heterojunction with the lightly-doped/undoped region. The method may also include forming a collector terminal. The collector terminal may be in contact with the collector region. The method may also include forming a gate terminal. The gate terminal may be in contact with the heterostructure. The method may also include forming an emitter terminal. The emitter terminal may be in contact with the lightly-doped/undoped region and the emitter region.

In the method of the second embodiment, the drift region may include an N− doped region.

In the method of the second embodiment, the doping the collector region may include performing P+ doping.

In the method of the second embodiment, the doping the emitter region may include performing n+ doping.

In the method of the second embodiment, the semiconductor substrate may include Gallium arsenide.

In the method of the second embodiment, the forming the heterostructure may include forming a heterostructure comprising Aluminum gallium arsenide.

In the method of the second embodiment, the forming the heterostructure may include forming a heterostructure comprising an n+ doped heterostructure.

In the method of the second embodiment, fabricating the transistor structure includes fabricating a structure that may be optically-controllable via illumination upon the gate terminal.

In the method of the second embodiment, fabricating the transistor structure may include fabricating a structure where a quantum well corresponding to the heterojunction provides a low resistance channel for a flow of electrons.

BRIEF DESCRIPTION OF THE DRAWINGS

For proper understanding of the invention, reference should be made to the accompanying drawings, wherein.

DETAILED DESCRIPTION

Figure 1:
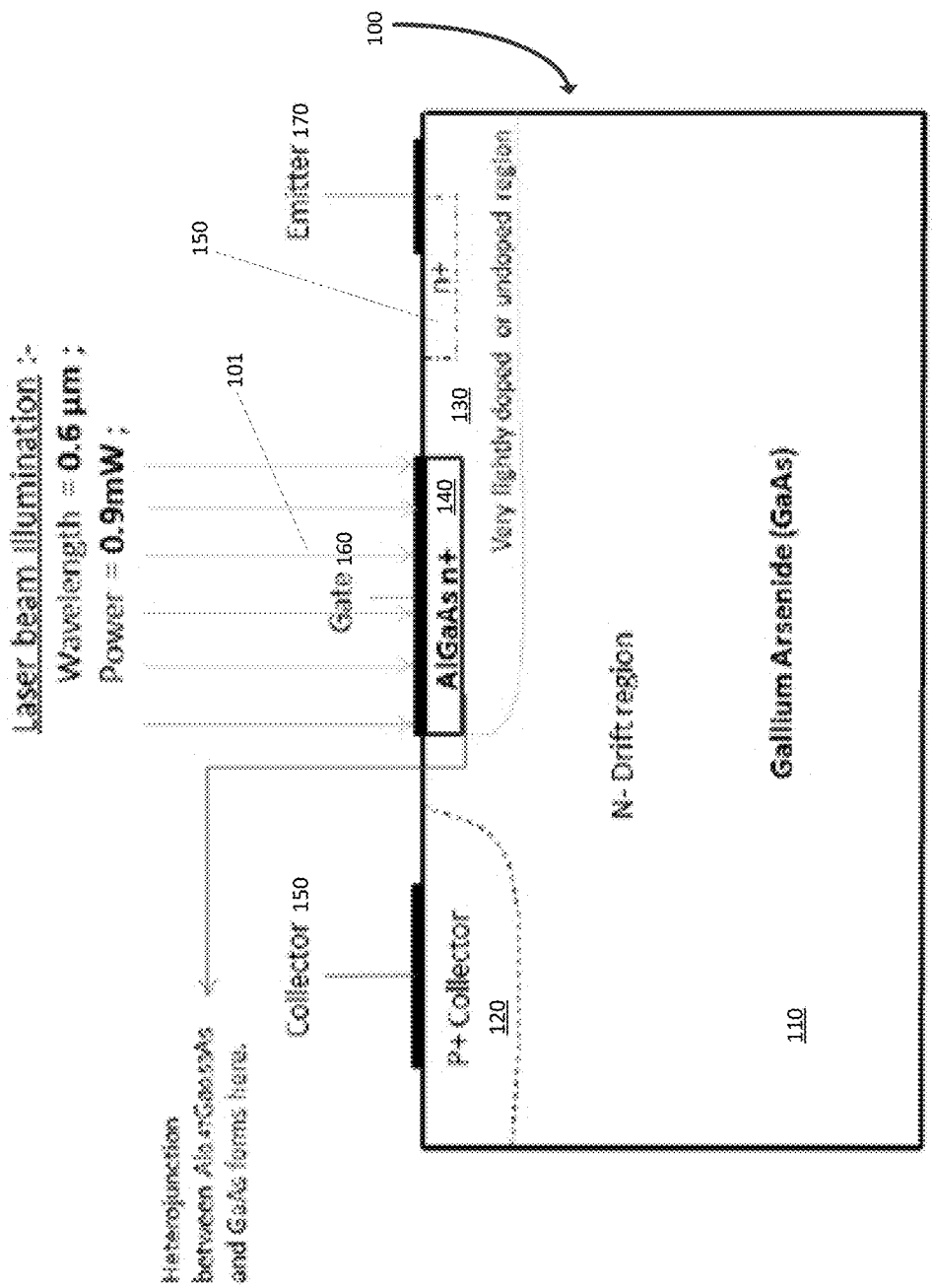
FIG. 1 illustrates a cross section view of a Heterojunction Schottky Gate Bipolar Transistor (HSGBT), in accordance with certain embodiments of the present invention.

Traditional silicon planar insulated-gate bipolar transistors (IGBT) are important components within power integrated circuits. Certain embodiments are directed to a power device that may be referred to as a Heterojunction Schottky Gate Bipolar Transistor (HSGBT), which may provide improvements over the traditional silicon planar IGBT. Compared to traditional IGBT, the HSGBT of certain embodiments may have the potential to carry a level of current that is at least 1000 times greater than the current that is carried by Si IGBT, and greater than the current that is carried by GaAS IGBT, of similar dimensions.

The HSGBT device of certain embodiments may form a quantum well by forming a junction between a first semiconductor material and a second, different semiconductor material. For example, the HSGBT device of certain embodiments may form a quantum well by forming a junction between Aluminum gallium arsenide (AlGaAs) and Gallium arsenide (GaAs). The quantum well may be formed in the conduction band of very lightly doped Gallium Arsenide (GaAs). The quantum well may provide a low resistance channel for the flow of electrons from a collector to an emitter of the HSGBT, thereby increasing the amount of current flow.

The HSGBT device of certain embodiments may form a quantum well by forming a junction between a heavily doped wider bandgap material (such as AlGaAs, for example) and a lightly doped/undoped narrower bandgap material (such as GaAs, for example). Forming this junction results in the formation of the quantum well in the GaAs, near the junction. This quantum well has a relatively higher concentration of electrons than the adjoining GaAs because of a real-space charge-carrier transfer of electrons from AlGaAs.

The electrons in this quantum well have a higher mobility because of reduced electron-ionized impurity scattering. Therefore, the electrons move relatively faster upon the application of electric field, resulting in lower resistance and, therefore, higher current. With certain embodiments of the present embodiment, the width of the quantum well may be approximately 0.5 micrometers (microns) wide. Changing the doping density of the AlGaAs layer by an order of 10 was generally not seen to result in any significant change in the performance of the device. The width of the quantum well may be determined based on the band gap differences of GaAs and AlGaAs.

The HSGBT device of certain embodiments may also have the potential to be optically controllable. For example, certain embodiments may be optically controlled by light in the visible spectrum. Specifically, the current flow of the HSGBT device can be controlled, based upon the characteristics of light that is incident upon the HSGBT device. As such, certain embodiments may be directed to a device that can be referred to as an optically-controlled HSGBT (OC HSGBT). The light that falls on the HSGBT device generates additional electron-hole pairs. The light also increases the number of electrons in the quantum well from the transfer of electrons from AlGaAs to the quantum-well. This increase in the total electrons, therefore, has the effect of further lowering the resistance of the channel, and therefore increasing the current.

By being optically controllable, the devices of certain embodiments may be suitable for use in high-power optoelectronic communication circuits, in addition to being suitable for use in traditional power integrated circuits. Further, because certain embodiments may provide the advantage of being able to carry an increased amount of current, certain embodiments may allow their corresponding integrated circuits to experience lower power dissipation losses FIG. 1 illustrates a cross section view of a Heterojunction Schottky Gate Bipolar Transistor (HSGBT) 100, in accordance with certain embodiments of the present invention.

Referring to FIG. 1, a P+ Collector region 120 is heavily doped with p-type impurities. P+ Collector region 120 is responsible for minority carrier injection into an N– drift region 110. The placement of an AlGaAs region 140 over the very lightly doped/undoped Body region is significant because the AlGaAs region 140 aids in the formation of a quantum channel through which electrons can move quickly. The Emitter region 150 is heavily doped with n-type impurities. The Emitter region 150 has a high density of electrons which move towards the N– drift region 110 and/or towards a lightly-doped/undoped region 130, upon the application of proper emitter voltage.

N– Drift region 110 is lightly doped with the n-type impurities. N–Drift region 110 is the region that collects the electrons flowing through emitter region and the minority carriers injected from P+ collector regions.

The device (of FIG. 1) may be optically-controlled by a light source (such as, for example, laser beam 101), as described above. In certain embodiments, HSGBT device 100 may be responsive to a range of visible light. In the example of FIG. 1, HSGBT 100 may be responsive to emitted light from laser beam 101, where the light of laser beam 101 may have a wavelength of 0.6 μm. Laser beam 101 may also comprise a 0.9 mW light source.

The energy of photons of the laser beam 101 that is used to control the HSGBT device 100 should be able to excite the electrons in the illuminated region, and, therefore, the energy of photons generate electron-hole pairs. Some of the additionally-generated electrons are transferred to the quantum-well. Therefore, the energy of the incident photons should be equal to or greater than the bandgap of the material, in this case, the bandgap of AlGaAs. The laser beam that is used in the example of FIG. 1 has the energy of 2.06 eV, which is sufficient to excite the electrons in the Aluminum Gallium Arsenide (AlGaAs) at the gate region, which has a band gap energy of 1.99 eV.

FIG. 1 illustrates different regions/layers of the HSGBT device 100 and the respective dopings of the different regions/layers. With certain embodiments, HSGBT 100 may include lightly doped (N–) drift region/layer 110. The N– drift region/layer 110 may comprise a semiconductor material. For example, with certain embodiments, N– drift region/layer 110 may comprise a III-V direct bandgap semiconductor such as Gallium Arsenide (GaAs), for example. HSGBT 100 may also include P+ doped collector region 120. The "N–" notation at the drift region generally indicates that the region is doped lightly with n-type impurities relative to the other regions marked with "n+", which are heavily doped with n-type impurities. The "P+" at the collector region indicates that the collector region is heavily doped with p-type impurities. HSGBT device 100 may also include lightly-doped/undoped region 130. The lightly-doped/undoped region 130 may be lightly doped and/or may be undoped. Further, HSGBT device 100 may also include n+ doped region 150.

With certain embodiments, HSGBT 100 may also include a heterostructure 140. Heterostructure 140 may comprise a semiconductor material that is different than the semiconductor material of the N– drift region 110. For example, with certain embodiments, heterostructure 140 may comprise Aluminum gallium arsenide (AlGaAs), while N– drift region 110 may comprise Gallium arsenide (GaAs). Each embodiment of present invention may use different alloys between Al and Ga. For example, the example of FIG. 1 utilizes an alloy where Al is 0.47, and Ga is 0.53. With other embodiments, heterostructure 140 may comprise Indium gallium arsenide or other types of III-V semiconductors, for example.

As illustrated by FIG. 1, at least one heterojunction may be formed between the N− drift region 110 and the heterostructure 140. In this case, the heterojunction is formed between Aluminum Gallium Arsenide (AlGaAs) and Gallium Arsenide (GaAs) (of the Body region of HSGBT 100). AlGaAs may be an alloy where a fractional composition of Al is 0.47 and the fraction composition of Ga is 0.53. Although this fractional composition is specifically mentioned, other embodiments may use different fraction compositions of different materials. AlGaAs is a wide band gap material and heavily doped. The GaAs material used in the body region may be undoped/very lightly doped. When a junction is formed between the GaAs and the AlGaAs, the junction results in the formation of a quantum channel where electrons can move freely and quickly.

As illustrated by FIG. 1, with certain embodiments, HSGBT device 100 may also include a collector terminal 150 that is in contact with the P+ doped collector region/layer 120. HSGBT device 100 may also include a gate terminal 160 that is in contact with heterostructure 140. HSGBT 100 may also include an emitter terminal 170 that is in contact with the lightly-doped/undoped region 130 and/or with n+ doped region 150. The emitter terminal 170 is in contact with both the n+ doped region 150 and the lightly-doped/undoped region 130.

Figure 2:
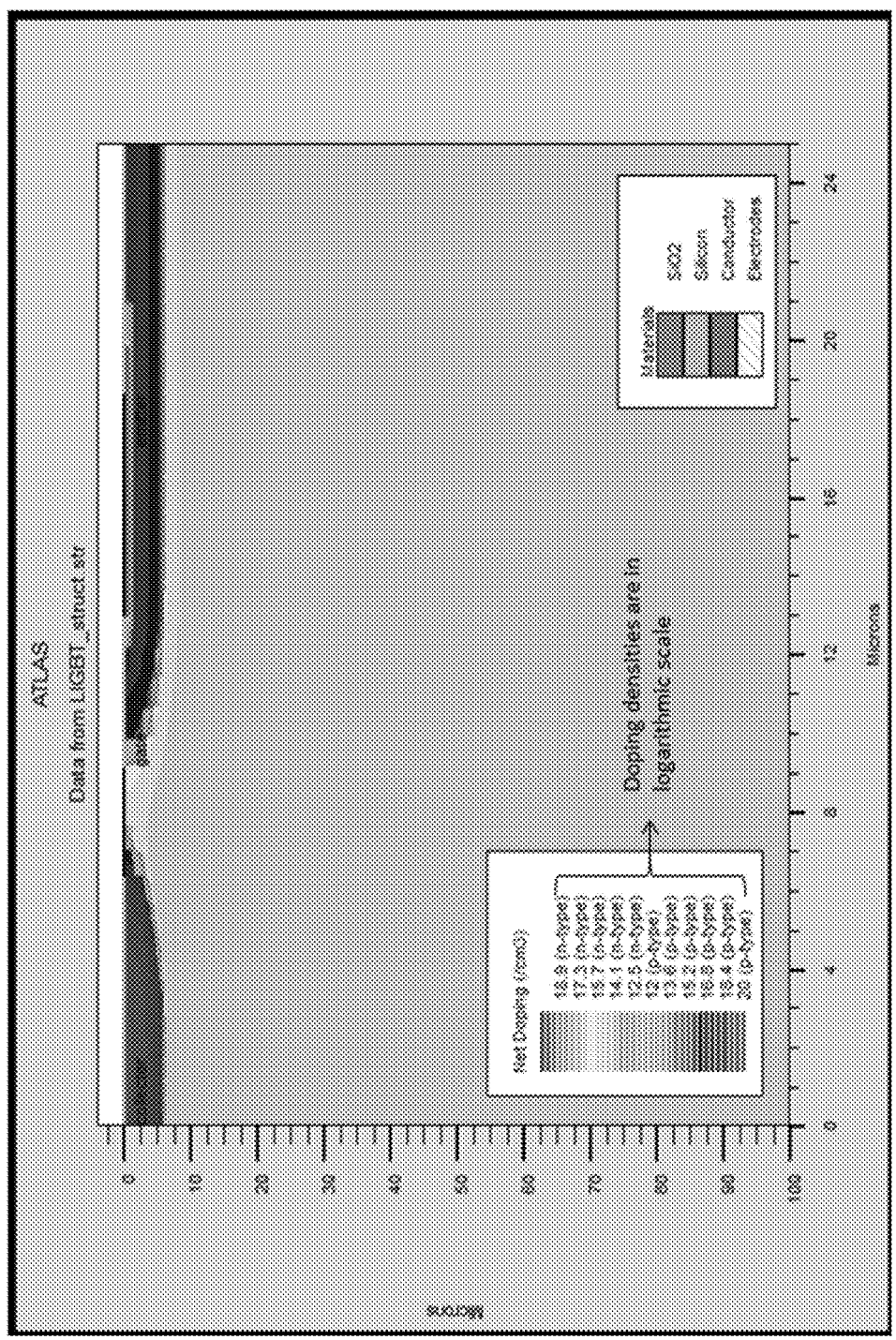
FIG. 2 illustrates doping densities in different regions of a silicon planar insulated-gate bipolar transistor (IGBT).

FIG. 2 illustrates doping densities in different regions of a silicon planar insulated gate bipolar transistor (IGBT). As illustrated by FIG. 2, a top portion of the silicon planar IGBT may include portions of Silicon dioxide ($SiO_2$). The silicon planar IGBT may also include a collector, a gate, and an emitter. As illustrated by FIG. 2, the area surrounding the collector and the area surrounding the emitter may have n-type doping.

Figure 3:
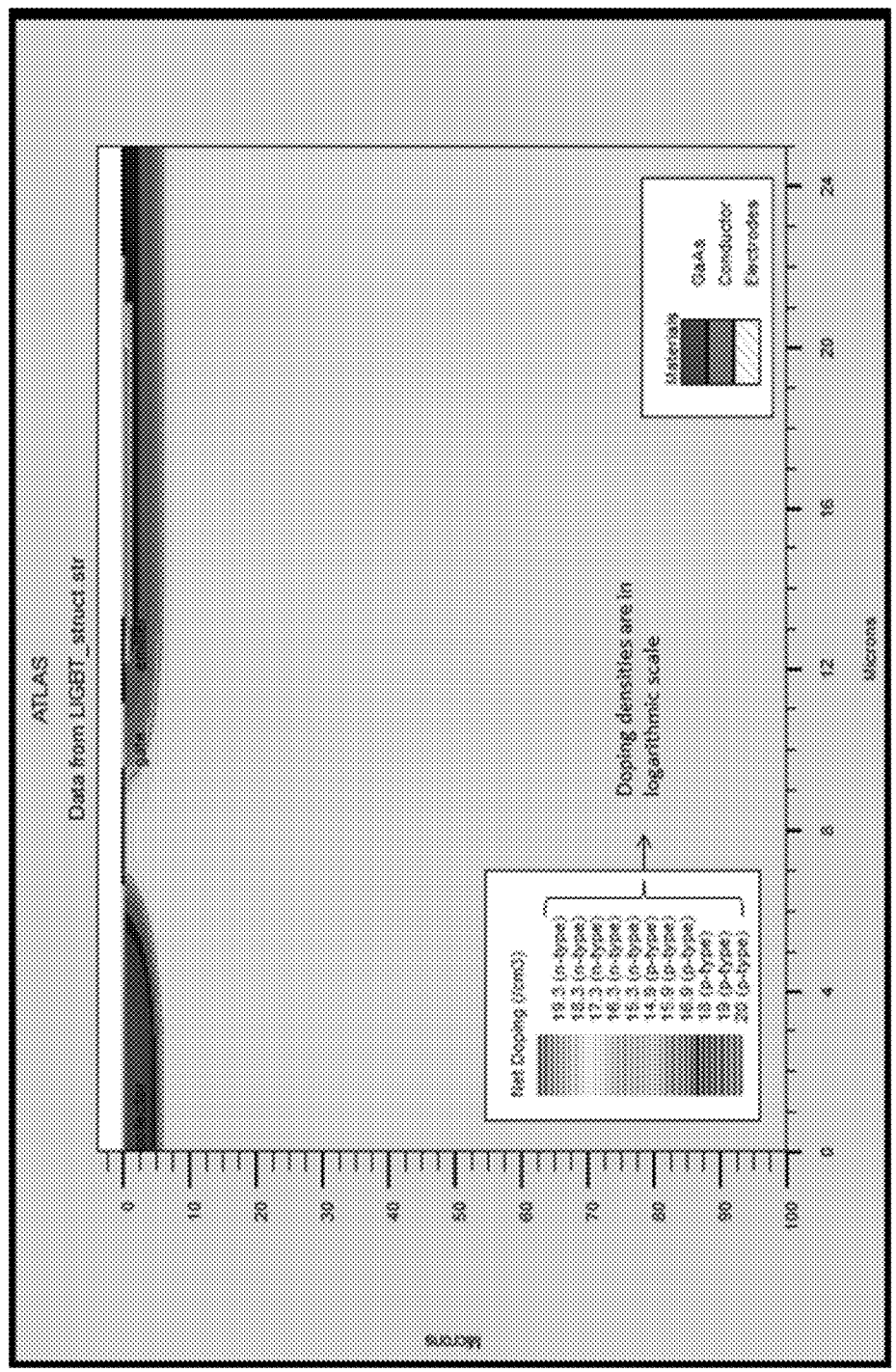
FIG. 3 illustrates doping densities in different regions of a Gallium Arsenide (GaAs) IGBT.

FIG. 3 illustrates doping densities in different regions of a Gallium Arsenide (GaAs) IGBT. The GaAs IGBT may also include a collector, a gate, and an emitter. As illustrated by FIG. 3, the area surrounding the collector may have p-type doping and the area surrounding the emitter may have n-type doping.

Figure 4:
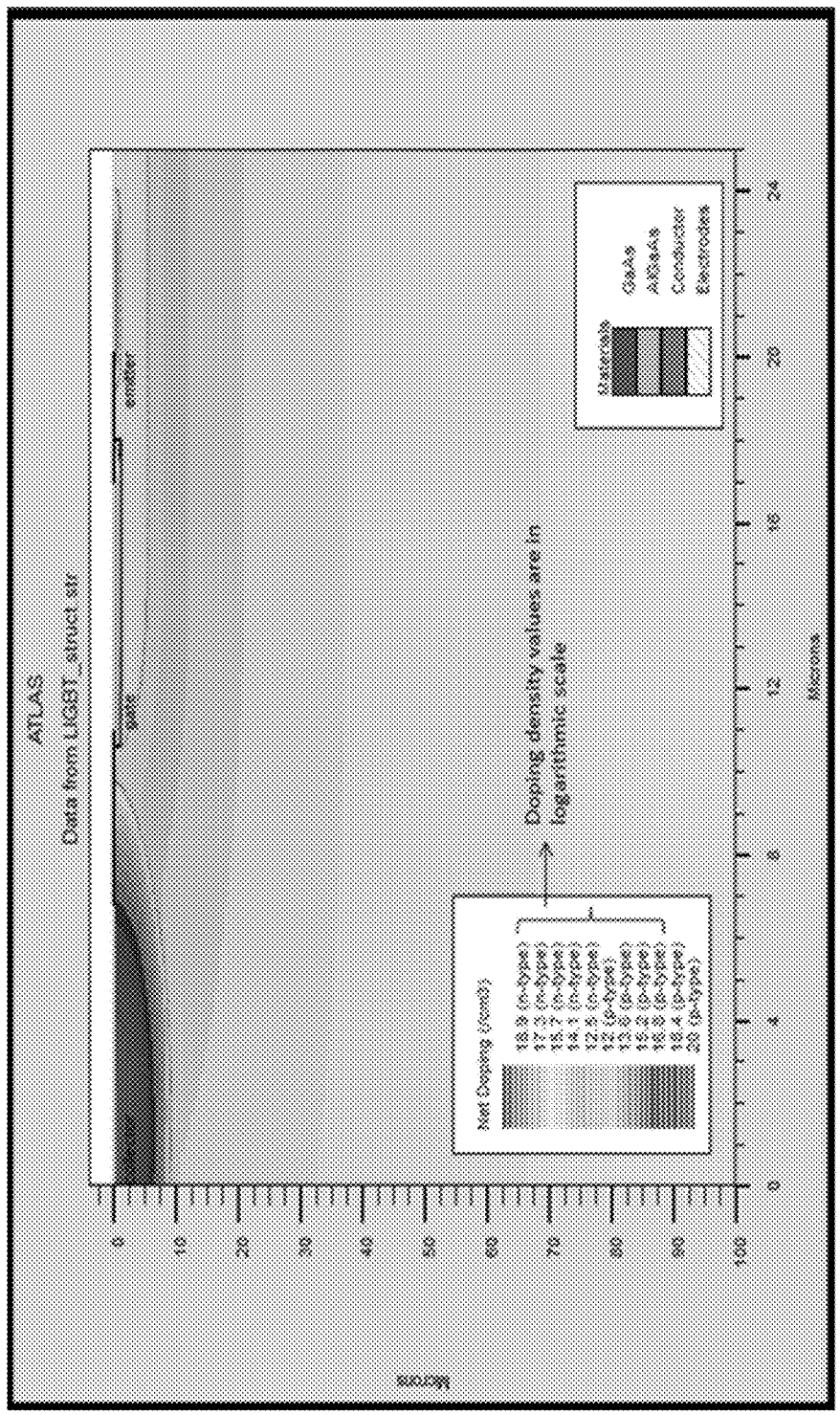
FIG. 4 illustrates doping densities in the different regions of an HSGBT device, in accordance with certain embodiments of the present invention.

FIG. 4 illustrates doping densities in the different regions of an HSGBT device 100, in accordance with certain embodiments of the present invention. With certain embodiments, the area surrounding the collector 150 (such as P+ doped collector region 120, for example) may have p-type doping. The p-type doping in the area surrounding the collector may have a doping concentration between around $10^{12}$ $cm^3$ and around $10^{20}$ $cm^3$, for example. The p-type doping in the area surrounding the collector may be between a depth of 0 to around 10 microns. The area surrounding the gate 160 and emitter 170 may have lighter p-type doping (i.e., lightly-doped/undoped region 130). The lighter p-type doping in the area surrounding the gate and emitter may be between a depth of 0 to around 5 microns. The p-type doping in the area surrounding the gate 160 and emitter 170 may have a concentration around $10^{12}$ $cm^3$, for example. As illustrated by FIG. 4, n-doped drift region 110 may have n-type doping, with a concentration between around $10^{141}$ $cm^3$ and around $10^{173}$ $cm^3$, for example.

Figure 5A:
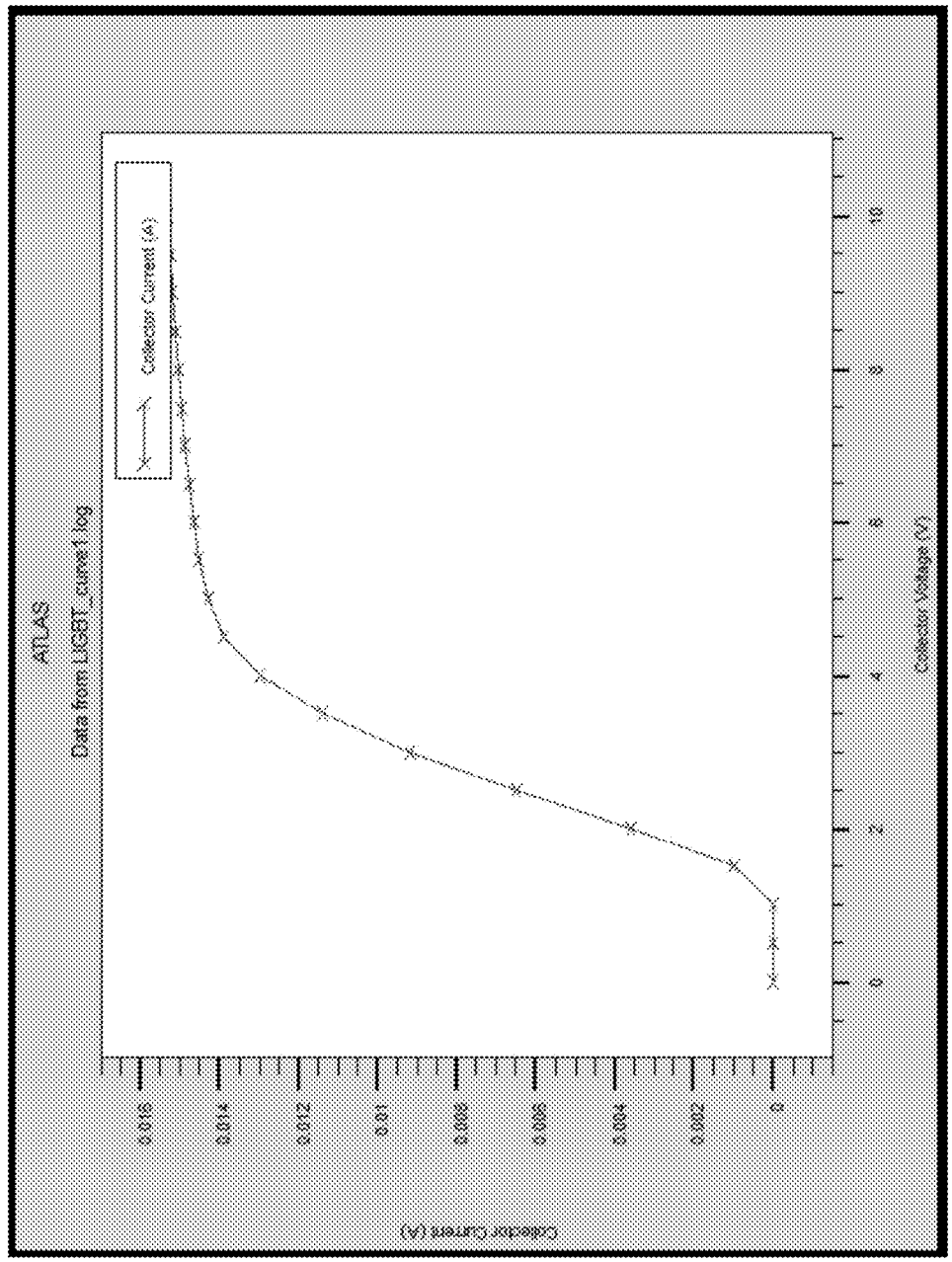
FIG. 5(a) illustrates a current in an HSGBT device, when controlled electrically, in accordance with certain embodiments.
Figure 5B:
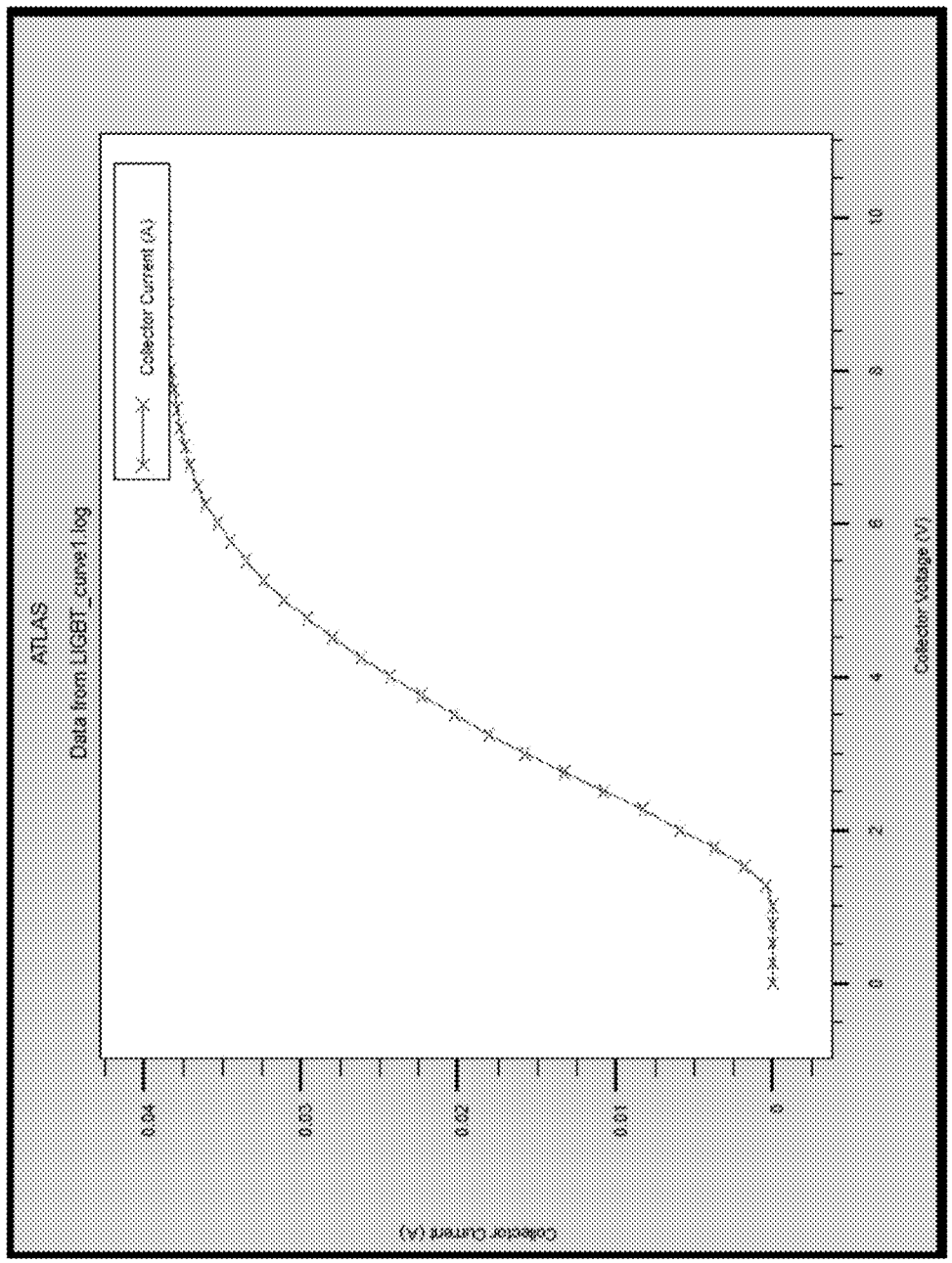
FIG. 5(b) illustrates a current in an HSGBT device when, controlled optically, in accordance with certain embodiments.

FIG. 5($a$) illustrates a current in an HSGBT device, when controlled electrically, in accordance with certain embodiments. As can be seen by FIG. 5($a$), the current is 0.016 A. FIG. 5($a$) illustrates current-voltage characteristics of HSGBT without light illumination.

FIG. 5($b$) illustrates a current in an HSGBT device, when controlled optically, in accordance with certain embodiments. As can be seen by FIG. 5($b$), the current is 0.04 A. FIG. 5($b$) illustrates current-voltage characteristics of optically-controlled HSGBT.

From the I-V characteristics of FIGS. 5($a$) and 5($b$), it is evident that the current in the HSGBT device that is controlled optically is higher than in the device that is not optically controlled. The device, when controlled optically, may carry a current that is 2.5 times higher. More importantly, the device can turn on without application of any gate voltage. Rather, the devices of certain embodiments may be turned on by simply shining light on the devices. These characteristics may make the device optically controllable. In this case, the light may play the role of the gate voltage, in the absence of the gate voltage.

The HSGBT devices (whether they are optically-controlled or whether they are without light illumination), may provide higher levels of collector current, as compared to the traditional silicon planar IGBT and Gallium Arsenide IGBT devices. The HSGBT device of certain embodiments, due to its construction, exhibits higher levels of collector current as compared to other traditional devices. The HSGBT device that is controlled optically may be found to have slightly higher currents than the device that is not optically controlled due to a generation of a larger number of electron-hole pairs by light illumination in the optically controlled device.

As described above, the Optically Controlled Schottky Gate Bipolar Transistor (OC HSGBT) of certain embodiments may function as a smart power optical device, which provides their corresponding circuits with a lower power loss. OC HSGBT may be utilized in smart power integrated circuits, as well as in high power opto-electronic circuits.

As described above, certain embodiments of the present invention may exhibit lower power losses, while providing a higher capability for carrying current. The heterojunction formed between a heavily-doped wide-bandgap AlGaAs and a very lightly-doped narrow-bandgap GaAs may result in the formation of a quantum well in the conduction band of the GaAs material. This quantum well has a higher concentration of electrons because of the real-space electron transfer from AlGaAs to the quantum well. The electrons in the quantum well are subject to reduced electron-ionized impurity scattering. The electrons there move relatively faster and thereby result in a higher current carrying capacity. Certain embodiments may have the flexibility to be controlled optically, as well as the ability to be controlled electrically. As such, certain embodiments may be used within high power circuit applications, including applications where IGBTs are being used, as well as within applications with high power optical communication circuits and systems.

The previous approaches generally used surface and bulk transport of electrons. As described above, embodiments of the present invention may use a real space electron transfer and transport through a quantum well. The quantum well may be formed at a heterojunction formed between wide and narrow bandgap semiconductors. Additionally, the device of certain embodiments may be controlled optically, unlike the devices that presently exist.

With regard to the implementation of certain embodiments, high quality GaAs and AlGaAs heterostructures can be grown on a GaAs(Si) substrate using a molecular beam epitaxy process. For p-type doping, Beryllium may be used. For n-type doping, Silicon may be used.

Further device layers may be created by standard photo-lithographic and wet chemical etching techniques. Different methods of fabricating the above-described device may involve different fabrication techniques. For certain embodiments, device fabrication may start on the (110) surface of a GaAs heterostructure crystal with n– epitaxial layer. A device pattern may be transferred onto the surface using photolithography (by using, for example, photoresist, aligning, and/or developing of the pattern), followed by a wet etching process. Next, the collector and emitter of device may be lightly doped. Finally, a heavily doped AlGaAs gate may be grown using, for example, molecular-beam epitaxy.

Figure 6:
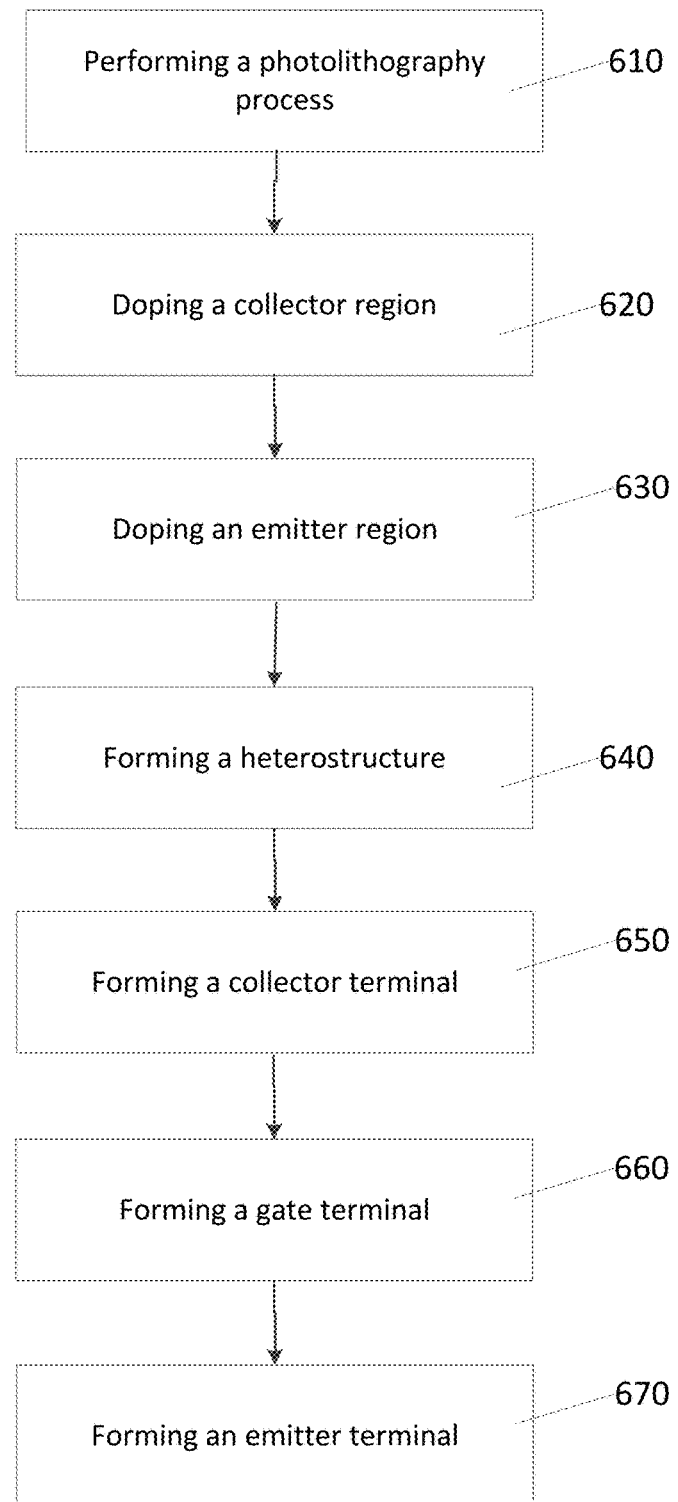
FIG. 6 illustrates a method of fabricating a device, in accordance with certain embodiments of the present invention.

FIG. 6 illustrates a method of fabricating a device, in accordance with certain embodiments of the present invention. The method may fabricate a transistor structure. The method, at 610, includes performing a photolithography process to transfer a device pattern onto a semiconductor substrate. The semiconductor substrate may include a drift region and a lightly-doped/undoped region. The lightly-doped/undoped region may be lightly-doped and/or undoped. The method, at 620, includes doping a collector region of the substrate. The method, at 630, includes doping an emitter region of the substrate. The method, at 640, includes forming a heterostructure. The heterostructure forms a heterojunction with the lightly-doped/undoped region. The method, at 650, includes forming a collector terminal. The collector terminal is in contact with the collector region. The method, at 660, includes forming a gate terminal. The gate terminal may be in contact with the heterostructure. The method may also include, at 670, forming an emitter terminal. The emitter terminal is in contact with the lightly-doped/undoped region and the emitter region.

The described features, advantages, and characteristics of the invention can be combined in any suitable manner in one or more embodiments. One skilled in the relevant art will recognize that the invention can be practiced without one or more of the specific features or advantages of a particular embodiment. In other instances, additional features and advantages can be recognized in certain embodiments that may not be present in all embodiments of the invention. One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

We claim:

1. A method for fabricating a transistor structure, the method comprising:
    performing a photolithography process to transfer a device pattern onto a semiconductor substrate, wherein the semiconductor substrate comprises a drift region and a lightly-doped/undoped region, and the lightly-doped/undoped region is lightly-doped and/or undoped;
    doping a collector region of the substrate;
    doping an emitter region of the substrate;
    forming a heterostructure, wherein the heterostructure forms a heterojunction with the lightly-doped/undoped region;
    forming a collector terminal, wherein the collector terminal is in contact with the collector region;
    forming a gate terminal, wherein the gate terminal is in contact with the heterostructure; and
    forming an emitter terminal, wherein the emitter terminal is in contact with the lightly-doped/undoped region and the emitter region.

2. The method according to claim 1, wherein the drift region comprises an N– doped region.

3. The method according to claim 1, wherein the doping the collector region comprises performing P+ doping.

4. The method according to claim 1, wherein the doping the emitter region comprises performing n+ doping.

5. The method according to claim 1, wherein the semiconductor substrate comprises Gallium arsenide.

6. The method according to claim 1, wherein the forming the heterostructure comprises forming a heterostructure comprising Aluminum gallium arsenide.

7. The method according to claim 1, wherein the forming the heterostructure comprises forming an n+ doped heterostructure.

8. The method according to claim 1, wherein fabricating the transistor structure comprises fabricating a structure that is optically-controllable via illumination upon the gate terminal.

9. The method according to claim 1, wherein fabricating the transistor structure comprises fabricating a structure where a quantum well corresponding to the heterojunction provides a low resistance channel for a flow of electrons.

* * * * *